METHOD OF MAKING SEMICONDUCTOR DEVICES UTILIZING VACUUM WELDING

Filed March 23, 1964

INVENTOR
William P. Peyser

BY [signature]

ATTORNEY 3,303,549
Patented Feb. 14, 1967

3,303,549

METHOD OF MAKING SEMICONDUCTOR DEVICES UTILIZING VACUUM WELDING

William P. Peyser, Nashua, N.H., assignor to Sanders Associates, Inc., Nashua, N.H., a corporation of Delaware Filed Mar. 23, 1964, Ser. No. 353,682
12 Claims. (Cl. 29—25.3)

This invention relates to the manufacture of semiconductor devices having abrupt or step junctions. More specifically, it relates to the manufacture of semiconductor devices such as diodes and transistors of any type of geometry, including closed configurations, in which junctions between portions having different types or degrees of conductivity are characterized by a markedly thin cross section. The junctions are formed by vacuum welding of the respective components defining the junctions.

In certain semiconductor devices employing junctions it is desirable that the junctions be as thin as possible. That is, it is desirable to minimize the thickness of the region in which both P-type and N-type impurities exist. There are certain inherent limitations in the degree to which this requirement can be attained with the methods employed prior to the present invention. For example, with the diffusion techniques widely used to dope semiconductor materials, the donor (or acceptor) impurities diffuse through the host crystal toward the plane where the junction is to be formed. There is a variation in the impurity density in the direction of diffusion. Thus, if a given impurity concentration is to be obtained at the junction, some of the diffusing material must travel past the junction, thereby creating a region of overlap.

Another limitation of the methods of making semiconductive device employed prior to the present invention is that devices having various geometries could not be fabricated. For example, geometrical configurations having closed surfaces of the concentric type could not be made.

Welding techniques have failed to be widely adopted because of the difficulty of controlling the welding process within the narrow tolerances required in most semiconductor devices. Furthermore, the heat evolved in the welding process may result in a substantial amount of undesirable diffusion of both types of impurities across the junction. Also, inside welds such as are required to make coaxial configurations could not previously be effectively made to produce a satisfactory transistor.

Conventional welding techniques, since they require the material to go through a liquid phase, cause a change in characteristic of the materials involved. Further, conventional welding techniques result in chemical and thermal shock to the components of the semiconductor devices being fabricated. It will also be appreciated that control of the position of the junction was rather difficult with prior techniques. In particular, the junction may define an irregular or uneven surface. If the portion of the component on one or both sides of the junction is thin, a very small displacement of the junction or a portion thereof will result in a fairly substantial percentage variation in the thickness of this portion. In particular, unequal penetration by the doping agent may result in a region in which a portion of the component on one side of the junction is relatively thin. Current then concentrates in this region. A hot spot may then develop, leading to destruction of the component. Similarly, if the resistivity along the junction varies, different voltage gradients may exist, again leading to destructive hot spots.

Furthermore, semiconductive junction devices made by presently known methods have their crystal lattice structure coextensive between the two layers forming the junction.

Accordingly, it is an object of the present invention to provide a method of making semiconductive devices having complex configurations and geometries.

Another object of the present invention is to provide a method of making an abrupt semiconductor junction, i.e., a junction having a thin region of overlap.

Another object of the invention is to provide a method of the above character capable of precise location of the junction and the various portions thereof.

Another object of the invention is to provide a method of the above character making use of existing techniques and thereby facilitating adoption by manufacturers of semiconductive devices.

Another object of the invention is to provide a method of making semiconductive devices whose crystal lattice structure may have any preselected orientation between layers.

Another object of the invention is to provide a method of making semiconductive devices wherein the characteristics of the materials making up the device are not changed during processing.

Other objects of the invention will in part be obvious and will in part appear hereinafter in connection with the following descriptions taken in connection with the accompaying drawings in which.

For purposes of clarity the same elements in the different figures all bear the same reference numbers.

In general, the present invention makes use of vacuum welding to form a P–N junction. The regions on the opposite sides of the junction are separately formed and shaped and then brought together in a vacuum welding process to secure them face-to-face with a resulting junction at their common surface.

More specifically, it is well known that if the contaminants on the surfaces of two crystalline bodies are removed and the surfaces are brought together in a vacuum, a weld is formed along the surfaces. The weld is produced at relatively low temperatures and without a great deal of pressure. Therefore, there is essentially no penetration of material from one of the welded bodies into the other body. As applied to semiconductor junctions, this means that if a member of P-type material and a second member of N-type material are provided with surfaces free of contaminants and then the surfaces are brought together in a vacuum, the weld will have the characteristics of a P-N junction and the junction will have practically no region of overlap. This results in semiconductive devices having superior electrical characteristics.

Moreover, the surfaces to be joined can be carefully finished prior to welding so as to provide almost exactly the desired contours. Specifically, they may be made planar so that the junction formed by the welding process has this configuration and is free from protrusions into either the N or P region.

Thus the process permits semiconductive devices of any geometrical configuration to be made. By the use of the process, complex configurations not heretofore possible can be made such as those having concentric elements and those requiring inside joining of elements, just to name a few examples. Furthermore, device utilizing both semiconductor and metallic elements can be fabricated by the process.

Semiconductive devices having any number of junctions can similarly be made. The process can be repeated as many times as desired without affecting the device and materials. Since excessive heat is not used and the materials do not go through a liquid phase as in welding, the characteristics of the materials do not change. There is no thermal or chemical shock. The characteristics of the finished devices are more readily predictable. Reject rate of the devices also becomes lower.

Any type of crystal lattice orientation between two layers of semiconductive materials can be selected by fabrication of the semiconductive material. Junctions between polycrystalline materials can similarly be made. Further a monocrystalline material can be joined to a polycrystalline material just as well. Since the degree of diffusion of the doping is not varied by the vacuum welding process of the invention, semiconductive devices having any desired degree of diffusion can be made by controlling this before the vacuum welding process is carried out.

Figure 1:
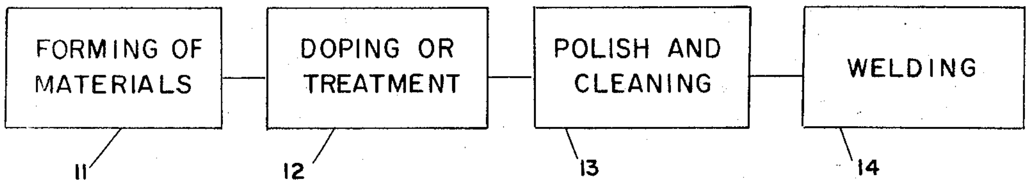
FIG. 1 is a diagram showing the several steps involved in carrying out the invention.

Referring to FIG. 1, the process designated by block 11 begins with the fabrication of the members forming the final product. In the case of a single junction diode two members, of course, are required. However, it will be apparent that devices incorporating any number of junctions or configurations may be fabricated according to the invention.

If doped or treated semiconductive material is utilized to start with, then the step designated by block 12, that is, doping or treatment, is not necessary. If undoped materials are used and depending on the type of semiconductive device desired, after step 11 has been carried out and the elements have been formed, either one or both of the elements are treated or doped in step 12.

The next stage of the process represented by block 13 is to polish and clean the semiconductive elements. This involves polishing of the surfaces to be joined by either electrical, chemical or mechanical means, and cleaning off all surface contaminants which would prevent welding in the final step.

As an alternative, if it is not desired to polish the surfaces of the elements to be joined in order not to remove the treated surface when step 12 is utilized, the polishing process discussed above can be carried out during step 11.

The prepared members to be joined are next inserted in a vacuum chamber which is then evacuated to the degree required for vacuum welding. Reduction to a pressure of $10^{-10}$ mm. of mercury, approximately the pressure at an altitude of 500 miles is sufficient.

Figure 2:
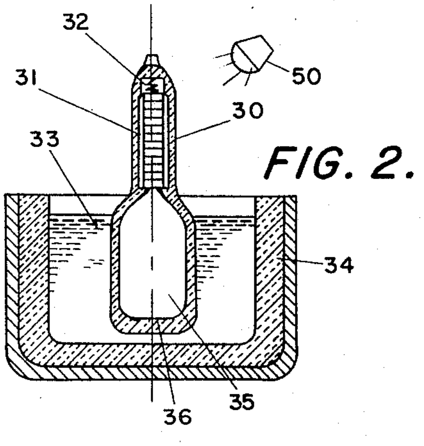
FIG. 2 shows one form of apparatus in section for carrying out one of the steps of the invention.
Figure 3:
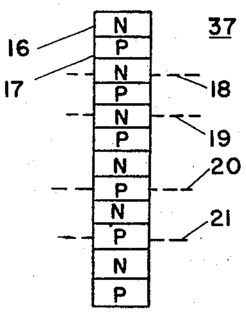
FIG. 3 is an enlarged view of a portion of the apparatus of FIG. 2 showing the arrangement of the semiconductive elements.
Figure 4:
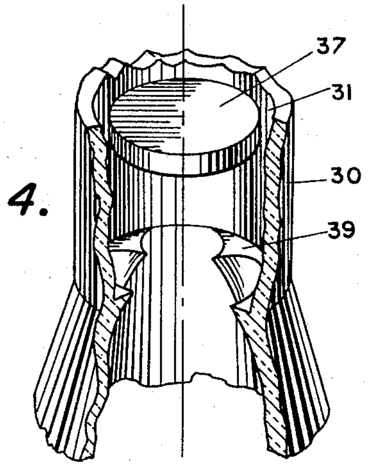
FIG. 4 is also an enlarged view of a portion of the apparatus of FIG. 2 showing the arrangement for supporting the semiconductive elements.

Referring now to FIGS. 2, 3, 4 and 5 which show one embodiment for carrying out the welding process of block 14; the processed semiconductor members are arranged in a stack shown in FIG. 3. N and P-type materials represented by reference characters 16 and 17 respectively are arranged alternatively. The stack of prepared members 37 are sealed in the specially constructed flask 30, shown in its entirety in FIG. 2. The flask 30 has a set of protuberances or supports 39 which hold the stack of members 37 in position. The protuberances 39 are designed such that the air can be evacuated from the upper portion through the openings designated 51. The inside dimensions of the top portion of the flask 30 in relation to the stack of members is such that there is a space 31 between the inside of the flask and the stack of members for the air to be evacuated from this portion of the flask. A spring 32 of suitable design held in position by the top of the flask puts pressure on the stack of members 37. To carry out step 14 the entire flask 30 with the stack 37 is placed in a suitably insulated container 34. The container is then filled with liquid helium which condenses the gases or air in the flask and produces a sufficient vacuum in the flask 30 to cause the individual semiconductive members to weld together. If desired the flask can be partially evacuated before sealing. The condensed gas or gases in the flask 30 settle to the bottom of the flask and are represented by the designation 36. During the process the top of the flask can be heated by the infrared source 50 or by induction heating or any other suitable means.

To avoid oxidation of the surfaces of the elements to be joined these elements can be processed in an inert atmosphere such as nitrogen or any other suitable gas. The elements 37 are then sealed in the flask 30 with an inert gas and then placed in the container 34. An alternative approach would be to coat the surfaces to be joined with a substance which prevents oxidation when air is used. Oil or a sublimating substance such as napththalene could be used among others to prevent oxidation of the surfaces to be joined. The oil, naphthalene or other substance used would be drawn off when a vacuum is produced in the flask.

After the welds have been made, the flask is then broken or cut open and the stack 37 of semiconductive materials now forming the semiconductor junctions is removed. For the example given, the stack 37 of FIG. 3 can be made into NPN or PNP junctions by cutting through at the appropriate places. For example, if an NPN configuration is desired the cut is made along the line 18. If, on the other hand, a PNP configuration is desired the cuts are made along lines 20 and 21.

Figure 6:
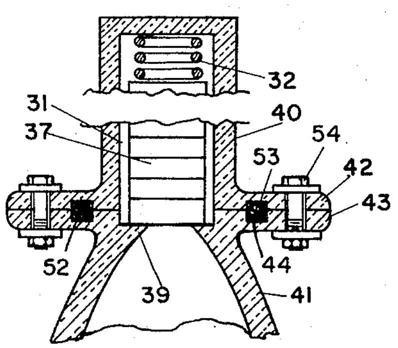
FIG. 6 shows a portion of the apparatus of FIG. 2 in section modified for reuse.
Figure 5:
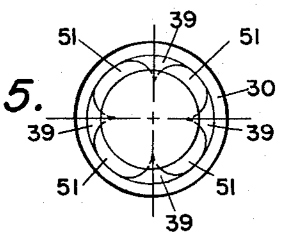
FIG. 5 is a top view of the portion of the apparatus of FIG. 4, showing the supports for the semiconductive elements and the openings for the evacuation of the apparatus.

The flask 30 shown in FIG. 2 has been generally designed for one time use. FIG. 6 shows in section a portion of a modified version of the flask 30 which has been designed for repeated use. Essentially the lower portion of flask 30 is provided with a flange 43 having a groove 44 for holding a sealing ring 52 such as an O ring of suitable material. The top portion 40 of the flask has a mating flange 42 and a groove 53 to mate with flange 43 and groove 44 of the lower portion. The two portions are fastened together with appropriate hardware, such as nuts, bolts and washers generally designated 54. The internal arrangement of the modified flask of FIG. 6 is the same as that of FIG. 2.

While the apparatus of FIGS. 2–6 has been shown as one means of carrying out the welding step 14, it is understood that any suitable arrangement for holding the semiconductive elements and for producing a suitable vacuum can be utilized.

For example, the flasks of both FIGS. 2 and 6 could be provided with an opening at the top (not shown) to which is attached suitable evacuating apparatus. Or, other types of vacuum chambers could be utilized.

As mentioned heretofore any number of semiconductive elements can be joined to make the final configuration. Some exemplary configurations are shown for illustrative purposes in FIGS. 7 and 8.

Although the matter of making connections to the various members has not been described it is to be understood that these can be fastened by means of the same welding process utilizing suitable jigs to hold the conductors and semiconductive elements in the desired position.

Figure 7:
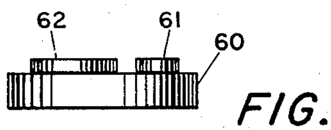
FIG. 7 shows one form of a semiconductive device made in accordance with the invention.
Figure 8:
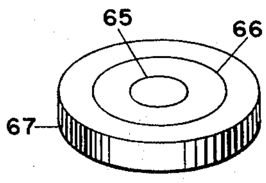
FIG. 8 shows another form of a semiconductive device made in accordance with the invention.

In FIG. 7 it is seen that the semiconductive members or elements 61 and 62 have been welded to the surface of the element 60. FIG. 8 shows a semiconductive device of the concentric type which it is now possible to fabricate utilizing the process of the invention. The separate members 65, 66 and 67 are treated, machined and polished to the proper dimensions. They are then placed in the vacuum chamber where the mating surfaces weld together as described heretofore.

By using the process described, multiple circuits of the integrated type can be fabricated. By proper forming, treating and finishing any number of elements can be arranged in any desired configuration.

When a vacuum chamber is used, there are a number of different ways in which articles may be manipulated within the chamber by remote control. However, under the high vacuum conditions used for vacuum welding, some of these devices which have a number of moving parts may undergo internal welding and thereby freeze. Care must therefore be taken to prevent such metal-to-metal contact in the manipulating mechanism as will result in such freezing. For example, bushings of ceramic instead of metallic materials may be used.

Another procedure is to eliminate the use of relatively moving parts by means of bellows extending into the chamber from opposite sides thereof. The two members to be joined are fastened to the interior ends of the respective bellows and when welding is to be accomplished, the bellows are expanded inwardly from outside of the chamber to bring the members together.

Ordinarily a moderate amount of pressure will be desirable during the welding process to ensure maximum surface contact. The pressure should be kept below the level at which appreciable diffusion will take place along the welded surfaces. Clamps of suitable design and material to provide the necessary pressure during the welding process are utilized.

It will be apparent to those skilled in the art that the semiconductive members which are to be joined must be metallurgically compatible, or else no weld or bond will be produced. It will also be apparent that the semiconductive members must be left in the vacuum chamber for a sufficient period of time to cause the weld or bond to be produced.

It will be apparent to those skilled in the art that the process or processes of the invention described herein can be carried out with any semiconductor members and/or other materials to be joined to said members that are metallurgically compatible. It is also apparent that the members to be joined must be subjected to vacuum for a sufficient period of time to cause the weld(s) or bond(s) to be produced.

As previously stated, the process of the invention results in semiconductor devices wherein there is no substantial amount of undesirable diffusion of both types of impurities across the junction of the devices being produced. This is assured by performing the process in such a manner that the temperature of the surfaces to be joined does not substantially exceed ambient temperature.

What is claimed is:

1. A method of manufacturing a semiconductor device, said method comprising the steps of separately making component members of said device, which members are metallurgically compatible and have different conductivities, cleaning those surfaces of said component members which are to be joined, placing said cleaned surfaces of said members in mating relationship, then vacuum welding said members in the absence of any substantial mechanical pressure thereon by subjecting them to a vacuum in the order of $10^{-10}$ millimeters of mercury at a temperature which does not substantially exceed ambient temperature for a sufficient length of time to cause bonding between the members to form a semiconductor junction therebetween.

2. A method of manufacturing a semiconductor device having an abrupt semiconductor junction, said method comprising the steps of forming at least first and second metallurgically compatible component members of said device, providing surfaces on the respective members at portions thereof having different electrical conductivities, removing contaminates from said surfaces, placing said surfaces in mating relationship, then vacuum welding said surfaces in the absence of any substantial mechanical pressure thereon by subjecting said surfaces to a vacuum in the order of $10^{-10}$ millimeters of mercury at a temperature which does not substantially exceed ambient temperature for a sufficient length of time to cause bonding between the surfaces so as to weld said members together over said surfaces.

3. The combination defined in claim 2 including the step of placing said members in a vacuum environment prior to the step of placing them in mating relationship to thereby gasify contaminates on said surfaces.

4. The combination defined in claim 3 including the step of heating said surfaces in said vacuum environment prior to the placing of said members in mating relationship, to thereby promote gasification of said contaminates.

5. A method of manufacturing a semiconductor device having connections for external attachment, said method comprising the steps of separately making at least first and second metallurgically compatible component members of said device having different conductivities, cleaning those surfaces of said component members which are to be joined, placing said cleaned surfaces of said members in mating relationship, then vacuum welding said members in the absence of any substantial mechanical pressure thereon by subjecting them to a vacuum in the order of $10^{-10}$ millimeters of mercury at a temperature which does not substantially exceed ambient temperature for a sufficient length of time to cause bonding between the members to form a semiconductor junction therebetween, and then vacuum welding said connections for external attachment to said component members.

6. A method of manufacturing a semiconductor device having component members of metallurgically compatible semiconductive material or metal, said method comprising the steps of fabricating said members of said device, removing contaminates from the surfaces of the members to be joined, placing said surfaces which are to be joined in mating relationship, then vacuum welding said members in the absence of any substantial mechanical pressure thereon by subjecting them to a vacuum in the order of $10^{-10}$ millimeters of mercury at a temperature which does not substantially exceed ambient temperature for a sufficient length of time to cause bonding between the members to form a semiconductor junction therebetween.

7. A method of manufacturing semiconductor devices having complex geometrical configurations including those of the concentric type, said method comprising the steps of fabricating component members of materials having desired conductivities, which members are metallurgically compatible, cleaning those surface of said component members which are to be joined, placing said cleaned surfaces of said members in mating relationship, then vacuum welding said members in the absence of any substantial mechanical pressure thereon by subjecting them to a vacuum in the order of $10^{-10}$ millimeters of mercury at a temperature which does not substantially exceed ambient temperature for a sufficient length of time to cause bonding between the members to form a semiconductor junction therebetween.

8. A method of manufacturing semiconductor devices having multiple elements, said method comprising the steps of fabricating the elements of said device of metallurgically compatible materials having different conductivities, cleaning those surfaces of said elements which are to be joined, placing said cleaned surfaces at the desired points of contact of said elements in mating relationship, then vacuum welding said elements in the absence of any substantial mechanical pressure thereon by subjecting them to a vacuum in the order of $10^{-10}$ millimeters of mercury at a temperature which does not substantially exceed ambient temperature for a sufficient length of time to cause bonding between the elements to form a semiconductor junction therebetween at said desired points of contact.

9. The method set forth in claim 8 further including the step of attaching external connection members to said elements by vacuum welding said external connection members to said elements.

10. A method of manufacturing semiconductor devices, said method comprising the steps of forming at least first and second component members of semiconductive material, finishing the surfaces to be joined so as to form clean metallurgically compatible surfaces, treating said component members to form surfaces of different conductivity, placing said cleaned surfaces of said members in mating relationship, then vacuum, welding said members in the absence of any substantial mechanical pressure thereon by subjecting them to a vacuum in the order of $10^{-10}$ millimeters of mercury at a temperature which does not substantially exceed ambient temperature for a sufficient length of time to cause bonding between the members to form a semiconductor junction therebetween.

11. A method of manufacturing semiconductor devices having complex geometrical configurations including those of the concentric type, said method including the steps of fabricating said component members of semiconductivee materials, finishing the respective members so that the surfaces at which they are to be joined are clean and capable of being placed in mating relationship with one another, treating said surfaces to produce metallurgically compatible layers of different desired conductivities, then vacuum welding said members by placing said surfaces together in mating relationship in the absence of any substantial mechanical pressure on said members, by subjecting said members to a vacuum in the order of $10^{-10}$ millimeters of mercury at a temperature which does not substantially exceed ambient temperature for a sufficient length of time to cause bonding between the members to form semiconductor junctions at said mated surfaces.

12. The method set forth in claim 8 further including the step of attaching external connection members to said component members by vacuum welding said external connection members to said component members.

References Cited by the Examiner

UNITED STATES PATENTS

| | | | |
|---|---|---|---|
| 2,743,201 | 4/1956 | Johnson | 148—184 |
| 2,897,105 | 7/1959 | Hunter | 148—184 |

FOREIGN PATENTS

| | | |
|---|---|---|
| 742,237 | 12/1955 | Great Britain. |

JOHN F. CAMPBELL, *Primary Examiner.*

WILLIAM I. BROOKS, *Examiner.*